United States Patent [19]

Machida

[11] Patent Number: 5,352,980
[45] Date of Patent: Oct. 4, 1994

[54] MAGNETIC RESONANCE IMAGING APPARATUS

[75] Inventor: Yoshio Machida, Tochigi, Japan

[73] Assignee: Kabushiki Kaisha Toshiba, Kawasaki, Japan

[21] Appl. No.: 22,956

[22] Filed: Feb. 25, 1993

[30] Foreign Application Priority Data

Feb. 27, 1992 [JP] Japan .................................. 4-041440

[51] Int. Cl.$^5$ .............................................. G01V 3/00
[52] U.S. Cl. ..................................... 324/307; 324/306
[58] Field of Search ............... 324/300, 306, 307, 309; 128/653.2, 653.3

[56] References Cited

U.S. PATENT DOCUMENTS 5,038,783  8/1991  Dumoulin ........................ 324/306
5,221,898  6/1993  Takiguchi et al. ............... 324/306

OTHER PUBLICATIONS

"Optimal-Quantitative Velocity Imaging with Tetrahedral Encoding Gradients", Conturo, T. J., et al., Radiology, 181(P), 189, (1991). (Month of Pub. unknown).

*Primary Examiner*—Louis Arana
*Attorney, Agent, or Firm*—Limbach & Limbach

[57] ABSTRACT

The MR imaging apparatus for imaging a moving spin, comprises a design unit for designing four sets of pulse sequences with four moment vectors, especially four first moment vectors, which can impart a phase shift to the moving spins, an acquiring unit for acquiring echo data by implementing the designed pulse sequences, a calculating unit for calculating a flow-related value of the moving spin, especially, a flow velocity using the echo data and a generating unit for generating image data of the moving spin using the calculated flow velocity. The first moment vectors correspond to four vertices of a tetrahedron respectively located in a 3-D moment space, a center of which coincides with an origin of the 3-D moment space.

14 Claims, 6 Drawing Sheets

MAGNETIC RESONANCE IMAGING APPARATUS

BACKGROUND OF THE INVENTION

This invention relates to a magnetic resonance(MR) imaging apparatus and, more particularly, to an MR imaging apparatus for imaging vessel structures using Phase Contrast(PC) angiography.

As is well known, a gradient with a net first moment imparts a phase shift to moving spins that is proportional to the velocity component along that gradient. The gradient is called a "flow encoding gradient".

The PC angiography generates vascular images by detecting changes in the phase of the blood's transverse magnetization using the flow encoding gradient.

Therefore, PC technique can distinguish flowing blood from surrounding stationary tissue.

To detect flow, PC angiography uses a bipolar gradient to encode a spin's velocity as a change of phase. The phase shift associated with such a gradient for the first acquisition is expressed as $$\phi = \gamma G V T \tau \tag{1}$$

where $\phi$ is the phase shift induced by flow in the transverse spin magnetization, $\gamma$ is the gyromagnetic ratio of the spin, G is a gradient amplitude, V is the component of the spin's velocity in the applied gradient's direction, T is the center-to-center time interval between the two gradient lobes, and $\tau$ is the application time of each gradient lobe.

For subsequent acquisitions, this pulse sequence inverts the polarity of the bipolar gradient. The polarity of the gradient is now negative, making the equation $$\phi = -\gamma G V T \tau \tag{2}$$

for the second acqusitton.

A stationary spin will have identical(zero) phase shifts for each polarity of the flow-encoding pulse, resulting in a zero net phase shift. Thus, when the two vectors are subtracted, the result is zero.

The vector subtraction of signals from spins moving with constant velocity is quite different. The two signals have the same magnitude but differnt phase. Consequently, when the vectors are subtracted, the resulting vector is not zero. The result is a signal originating from vascular structures with nearly complete elimination of stationary tissues from the MR angiogram.

the value of $\gamma G T \tau$ is called a first moment which designates a gradient potential causing a phase shift to a moving spin.

Therefore, if $\gamma G T \tau$, $-\gamma G T \tau$ for a x-axis are expressed as $m_{x+}$, $m_{x-}$ respectively and a velocity of the moving spin along the x-axis is expressed as $v_x$, then a phase shift $\phi_{x+}$, $\phi_{x-}$ are expressed as $$\phi_{x+} = m_{x+} v_x \tag{3}$$

$$\phi_{x-} = m_{x-} v_x \tag{4}$$

Thus the velocity is expressed as $$v_x = (\phi_{x+} - \phi_{x-})/(m_{x+} + m_{x-}) \tag{5}$$

As shown in the above equation, the phase shift $(\phi_{x+} - \phi_{x-})$ equals to the product of the velocity $v_x$ and the differential of the first moment $\Delta m = (m_{x+} - m_{x-})$.

The differential value $\Delta m$, in order to acquire a high S/N ratio images, must be set to a reasonably large value so that the phase shift becomes typically $\pi$, but in order to prevent a phase dispersion which induces velocity noises, the absolute values of $m_{x+}$, $m_{x-}$ must be set to a reasonably small value.

When 3-D images are acquired, two excitations are needed by each directions and thus six excitations, i.e. six-point method must be made.

Such method causes a long acquisition time.

In order to prevent the long acquisition time, so called four-point method is effective because only four excitations may be implemented. In the four-point method, four moments correspond to three points for the x, y and z direction respectively and the origin of the moment space(null phase).

In the four-point method, however, because the absolute values of the moments for the x,y and z direction, are too large, the phase dispersion may be induced and the S/N ratio of image data acquired using the four-point method may decrease.

SUMMARY OF THE INVENTION

An object of this invention is to provide an MR imaging apparatus for generating vascular images in a high S/N ratio by Phase Contrast(PC) angiography in a less excitation numbers or a less acquisition time.

According to this invention, there is provided an MR imaging appratus for imaging a moving spin, comprising:

means for designing predetermined sets of pulse sequences with predetermined moment vectors respectively which impart a phase shift to the moving spin;

means for acquiring echo data by implementing said pulse sequences;

means for calculating a flow-related value of the moving spin using the echo data; and means for generating image data of the moving spin using the flow-related value, wherein the moment vectors correspond to four vertices of a tetrahedron respectively located in a 3-D moment space, a center of which coincides with an origin of the 3-D moment space.

In one preferred embodiment, the moment vectors are first moment vectors and the flow related value is a flow velocity.

In another preferred embodiment, a moment vector is added to the four moment vectors which corresponds to the center of the tetrahedron.

According to this invention, there is further provided an MR imaging apparatus for imaging a moving spin, comprising:

means for designing predetermined sets of pulse sequences with predetermined moment vectors respectively which impart a phase shift to the moving spin;

means for acquiring echo data by implementing said pulse sequences;

means for calculating a flow-related value of the moving spin using the echo data; and means for generating image data of the moving spin using the flow-related value, wherein the moment vectors correspond to three vertices of a triangle respectively located in a 2-D moment space, a center of which coincides with an origin of the 2-D moment space.

In one preferred embodiment, the moment vectors are first moment vectors and the flow related value is a flow velocity.

In another preferred embodiment, a moment vector is added to the three moment vectors which corresponds to the center of the triangle.

BRIEF DESCRIPTION OF THE DRAWINGS

For a more complete understanding of this invention, reference will be made to the following detailed explanations in conjunction with the accompanying drawing in which.

DESCRIPTION OF THE PREFERRED EMBODIMENTS

Figure 1:
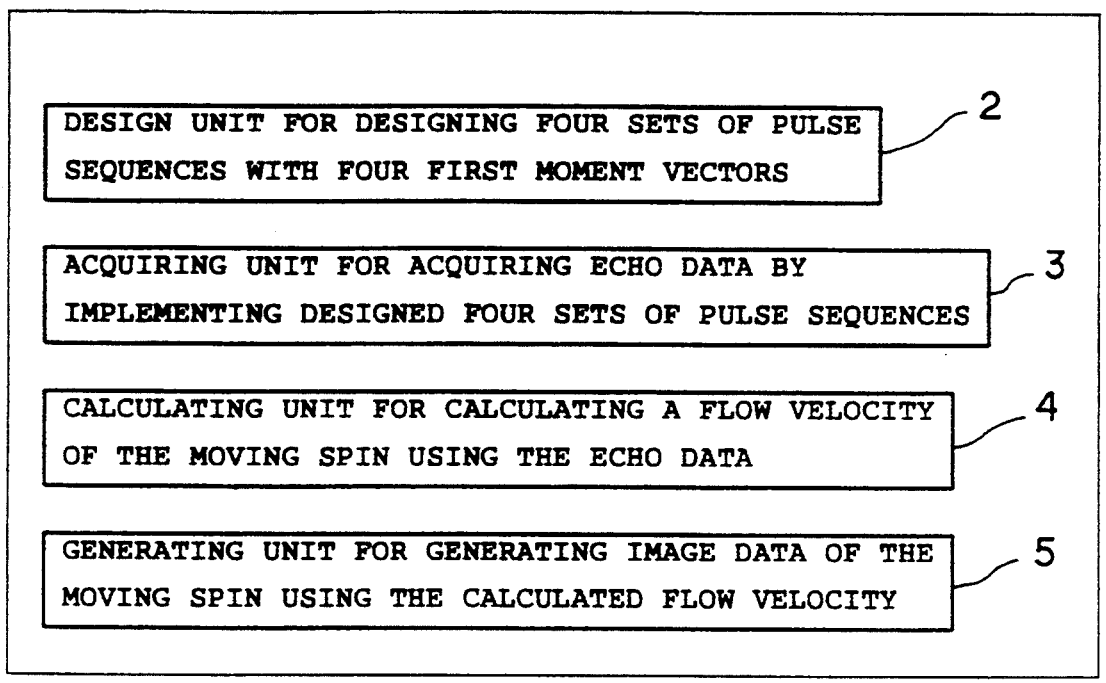
FIG. 1 is a block diagram showing an MR imaging apparatus embodying this invention.

Referring now to the accompanying drawing, the MR imaging apparatus 1 for imaging a moving spin, as shown in FIG. 1, comprises a design unit 2 for designing four sets of pulse sequences with four moment vectors, especially four first moment vectors, which can impart a phase shift to the moving spins, an acquiring unit 3 for acquiring echo data by implementing the designed pulse sequences, a calculating unit 4 for calculating a flow related value of the moving spin, especially, a flow velocity using the echo data and a generating unit 5 for generating image data of the moving spin using the calculated flow velocity.

The acquiring unit 3 comprises a magnet for applying a static magnetic field to a patient, a gradient coil for superimposing gradients on the static field, an RF coil for transmitting an RF pulse to the patient and receiving the MR signal as echo data from the patient etc., but these are not shown in FIG. 1.

The first moment vectors correspond to four vertices of a tetrahedron respectively located in a 3-D moment space, a center of which coincides with an origin of the 3-D moment space.

Figure 2:
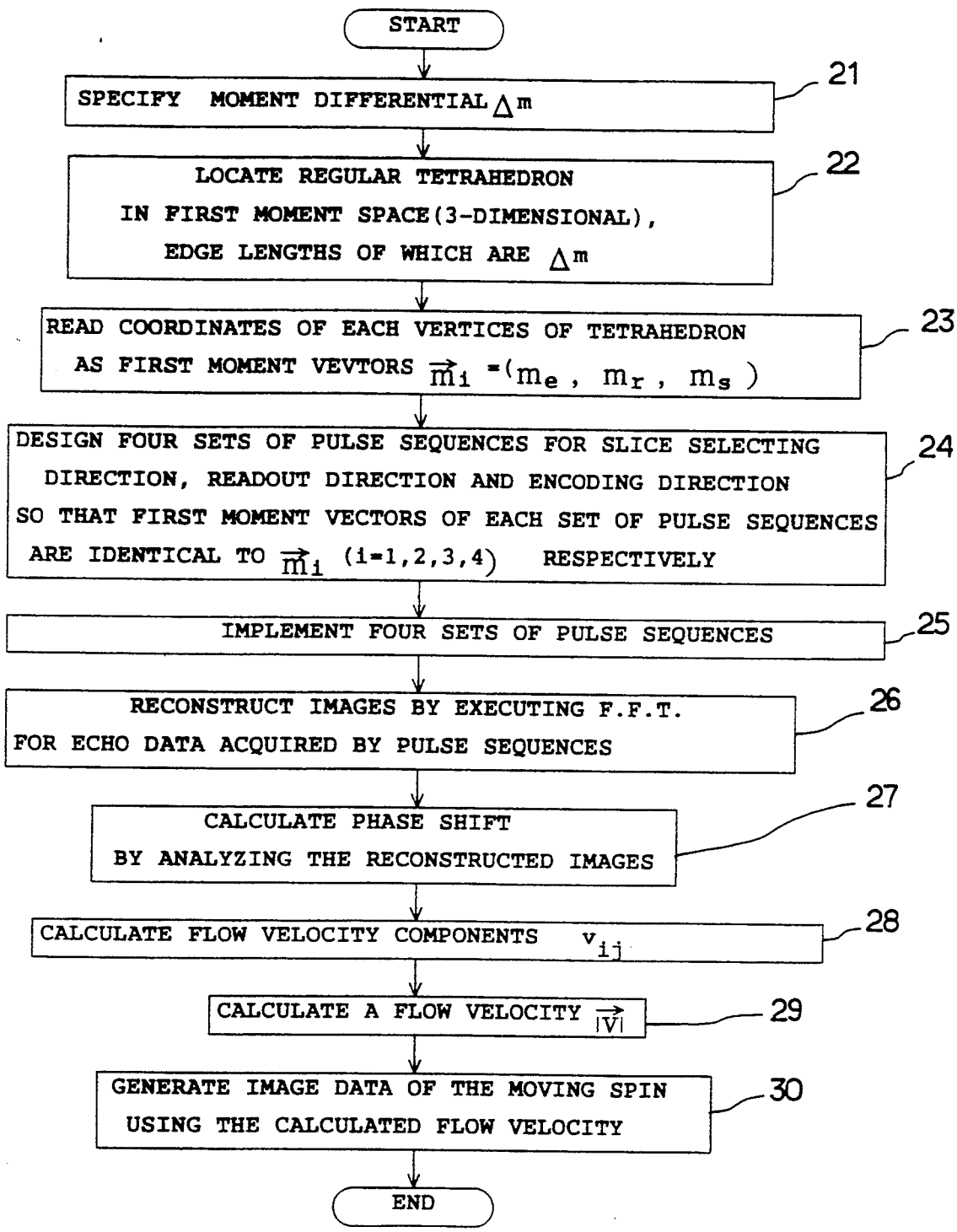
FIG. 2 is a flow chart showing the operation of the embodiment.

FIG. 2 is a flow chart showing the operation of the MR imaging apparatus 1.

In the operation of the MR imaging apparatus 1, first of all, a moment differential $\Delta m$ is specified(STEP 21). Since a flow velocity equals to a phase shift divided by $\Delta m$ and the maximum phase shift value must be set to, for example, about $\pi$, as explained in the prior art, an optimal $\Delta m$ must be decided according a flow velocity in the vessel structures to be imaged, for example 1 m/sec.

A tetrahedron which edge lengths are $\Delta m$, then, is located in the 3-D first moment space so that a center of the tetrahedron coincides with an origin of the 3-D moment space(STEP 22).

Figure 3:
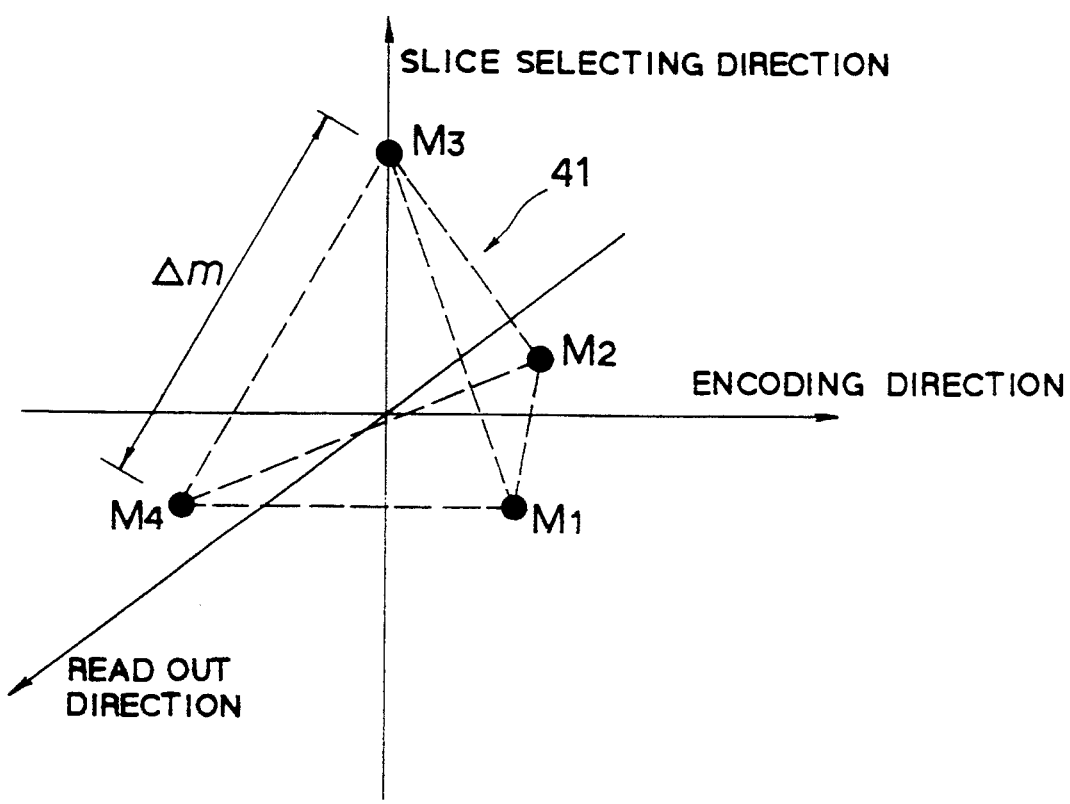
FIG. 3 is a perspective view showing a location of the four first moment vectors in the 3-D first moment space.

FIG. 3 shows an example of the located tetrahedron 41.

Each coordinates of four vertices $M_1$, $M_2$, $M_3$ and $M_4$ of the tetrahedron 41, then, are read as first moment vectors $\vec{m}_i$ ($m_e$, $m_r$, $m_s$), $i=1,2,3,4$ respectively(STEP 23). $\vec{m}_i$ ($i=1,2,3,4$) becomes:

$$m_1 = (1/2\Delta m, \sqrt{3/6}\ \Delta m, -\sqrt{6/12}\ \Delta m) \quad (6)$$

$$m_2 = (0, -\sqrt{3/3}\ \Delta m, -\sqrt{6/12}\ \Delta m)$$

$$m_3 = (0, 0, \sqrt{6/4}\ \Delta m)$$

$$m_4 = (-1/2\Delta m, \sqrt{3/6}\ \Delta m, -\sqrt{6/12}\ \Delta m)$$

Next, four sets of pulse sequences are designed so that each first moment vectors of the pulse sequences are identical to $\vec{m}_i$ ($i=1,2,3,4$) respectively(STEP 24).

Figure 4A:
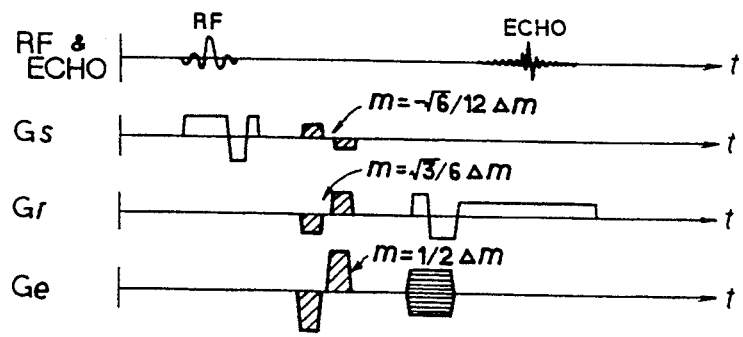
FIGS. 4A–4D shows the designed four sets of pulse sequences.
Figure 4B:
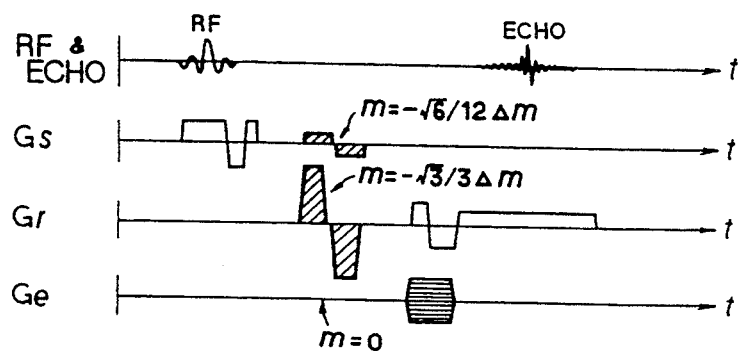
Figure 4C:
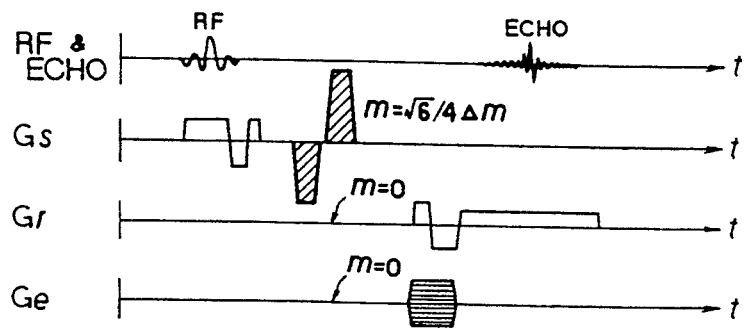
Figure 4D:
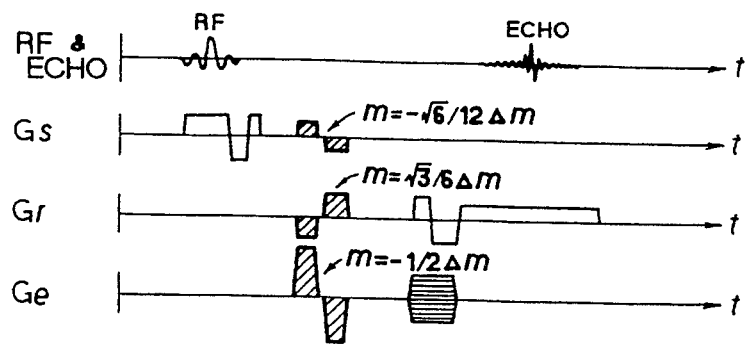

FIG. 4(a),(b),(c) and (d) shows the designed four sets of pulse sequences with flow encoding gradients designated as hatched region, each first moments of which are $\vec{m}_1$, $\vec{m}_2$, $\vec{m}_3$, and $\vec{m}_4$ respectively. Gradient amplitude G, application time $\tau$, interval T etc., can be set arbitrarily.

These pulse sequences are implemented to acquire the MR signal as echo data(STEP 25), the echo data are reconstructed by F.F.T.(STEP 26), phase shifts are calculated by using the reconstructed image data(STEP 27) and then flow velocity components $v_{ij}$ are calculated(STEP 28). $v_{ij}$ is flow velocity component calculated by using $\vec{m}_i$ and $\vec{m}_j$.

Then the flow velocity V becomes:

$$V^2=(\tfrac{1}{6})\Sigma v_{ij}^2(i\neq j,\ i=1,2,3,4, j=1,2,3,4) \quad (7)$$

Finally, blood image data are generated by using the calculated flow velocity(STEP 30).

In the above embodiment, flow encoding pulses included in each set of pulse sequences, are designed so that the first moment vectors of each set of pulse sequences correspond to vertices of a tetrahedron.

Therefore, only four acquisitions are needed, which number is less the prior six-point method and thus the total acquisition time can be decreased.

Furthermore, the location of the vertices are close to an origin of the tetrahedron and therefore the magnitude of the first moments are not so large. Thus the phase dispersion which causes the decrease of S/N ratio, can decrease effectively in comparison with the prior four-point method.

Figure 5:
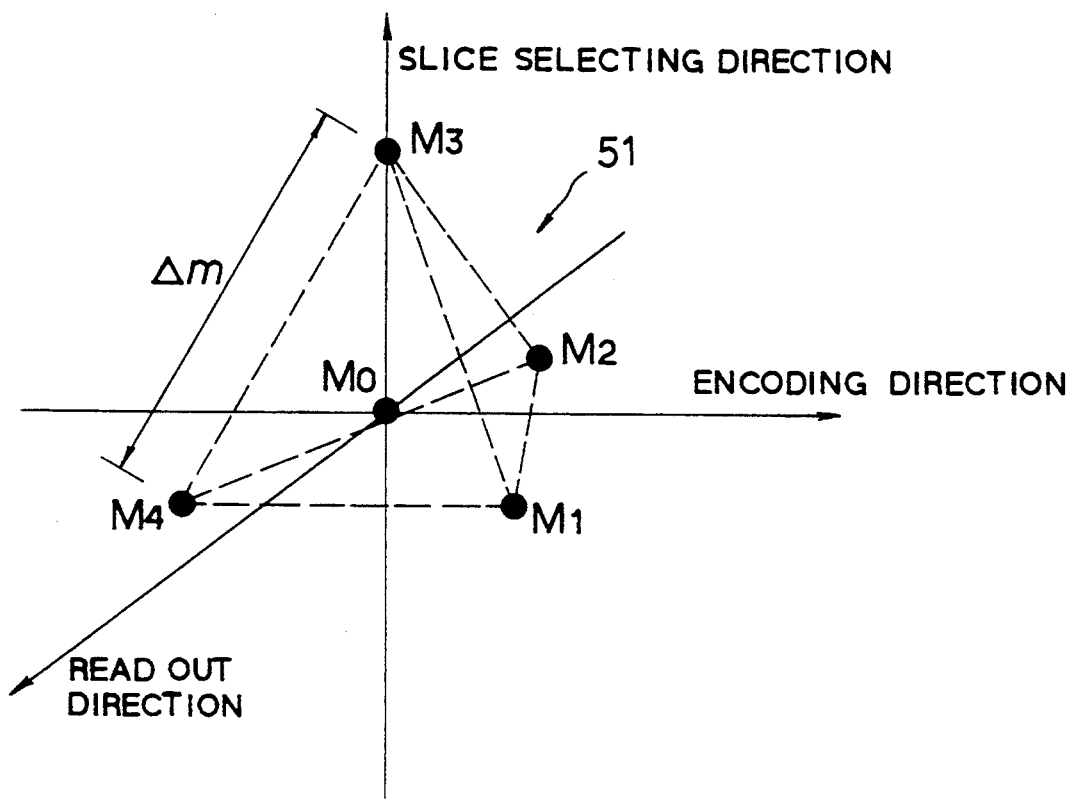
FIG. 5 is a perspective view showing a location of five calculated first moment vectors in the 3-D first moment space where a moment vector in the center of the tetrahedron is added to the four moment vectors shown in FIG. 3.

FIG. 5 shows another preferred embodiment of the invention where a moment vector $\vec{m}_0$ is added to the four moment vectors $\vec{m}_i$ ($i=1,2,3,4$) which corresponds to the center $M_0$ of the tetrahedron 51.

Figure 6:
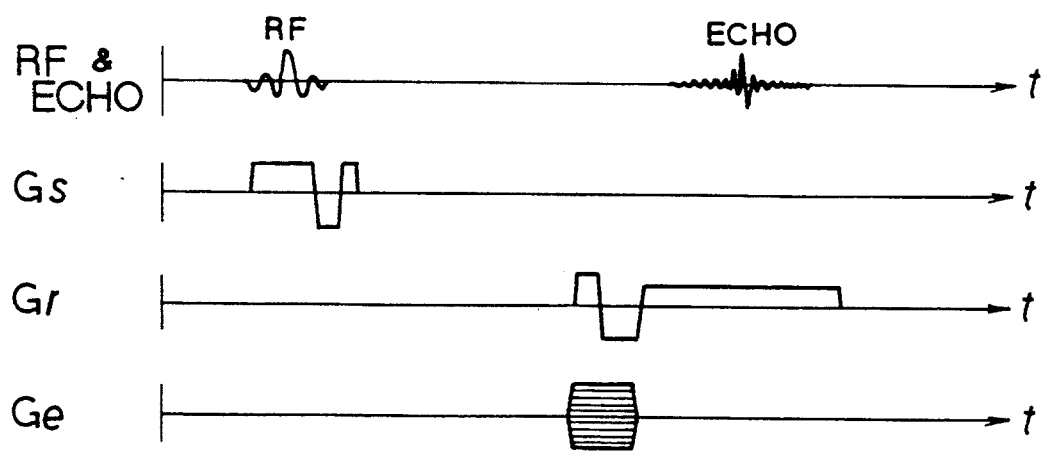
FIG. 6 shows a pulse sequence with the added first moment vector.

FIG. 6 shows a pulse sequence with the added first moment vector $\vec{m}$. As shown in FIG. 6 the first moment vector $\vec{m}_0$ is null vector and therefore does not impart the phase shift to the moving spin.

The operation of the second embodiment, is similar to the operation for the first embodiment, but there is a difference compared with the first embodiment where $v_{ij}$ are calculated by using $\vec{m}_i$ and $\vec{m}_j$ and furthermore $v_i$ are calculated by using $\vec{m}_i$ and $\vec{m}_0$.

The other flow velocity V' becomes:

$$V'^2 = (\tfrac{1}{4})\Sigma v_i^2 (i=1,2,3,4) \tag{8}$$

Therefore two different velocities can be detectable simultaneously and thus the narrow sensitive velocity range which appeared in MR Angiography techniques using phase shift effects, can be alleviated.

Figure 7A:
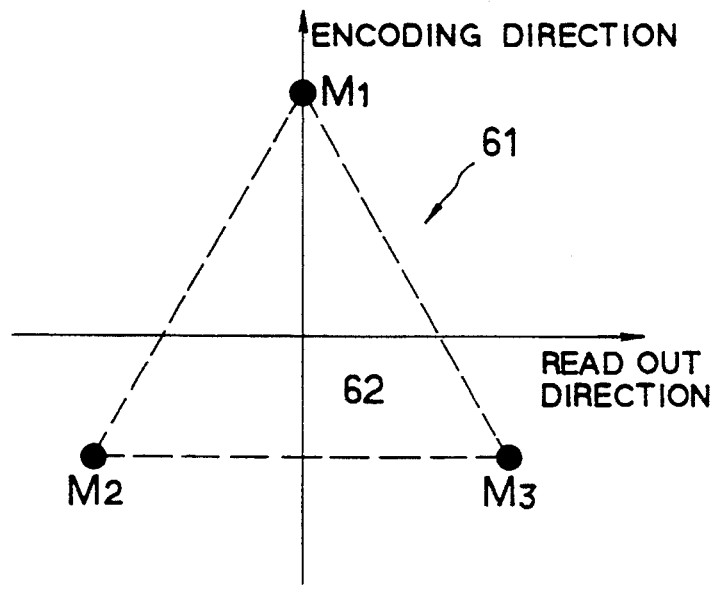
FIG. 7 shows locations of first moment vectors in the 2-D first moment space.

FIG. 7(a) shows further preferred embodiment of the invention where the moment vectors $\vec{m}_i$ (i=1,2,3) correspond to three vertices $M_1$, $M_2$ and $M_3$ of a triangle 61 respectively located in a 2-D moment space, a center of which coincides with an origin 62 of the 2-D moment space.

In the operation of the embodiment, similarily in the 3-D imaging, three sets of pulse sequences are designed so that each first moment vectors of the pulse sequences are identical to $\vec{m}_i$ (i=1,2,3) respectively, these pulse sequences are implemented to acquire the MR signal as echo data, the echo data are reconstructed by F.F.T., phase shifts are calculated by using the reconstructed image data and then flow velocity components $v_{ij}$ are calculated. $v_{ij}$ is flow velocity component calculated by using $\vec{m}_i$ and $\vec{m}_j$.

Then the flow velocity V becomes:

$$V^2 = (\tfrac{1}{3})\Sigma v_{ij}^2 (i \neq j, i=1,2,3, j=1,2,3) \tag{9}$$

Finally, blood image data are generated by using the calculated flow velocity.

In the prior art, in order to acquire the two dimensional image data, four-point method or three-point method must be implemented. In the four-point method, the image data is acquired by using the four sets of pulse sequences with four first moment vectors $m_{r+}, m_{r-}, m_{e+}$ and $m_{e-}$ respectively. The $m_{r+}$, $m_{r-}$ are first moment vectors for the readout direction, absolute values of which equal to each other and polarities of which are different. Similarily, $m_{e+}$ and $m_{e-}$ are first moment vector for the encoding direction, absolute values of which equal to each other and polarities of which are different.

This four-point method needs four excitations and thus a total acquisition time is long, however the embodiment needs only three excitations and thus can decrease the total acquisition time.

In the three-point method in the prior art, the image data is acquired by using the three sets of pulse sequences with three first moment vectors $m_r, m_e$ and $m_0$ respectively. The $m_r$ and $m_e$ are first moment vectors for the readout direction and the encoding direction respectively and the $m_0$ is a vector which corresponds to a origin of the 2-D moment space.

In the three-point method, the $m_r$ and $m_e$ must have large values and thus causes phase dispersion, however the embodiment uses three first moment vectors which are not so large in comparison with the prior art and thus can decrease the phase dispersion to acquire image data having a high S/N ratio.

Figure 7B:
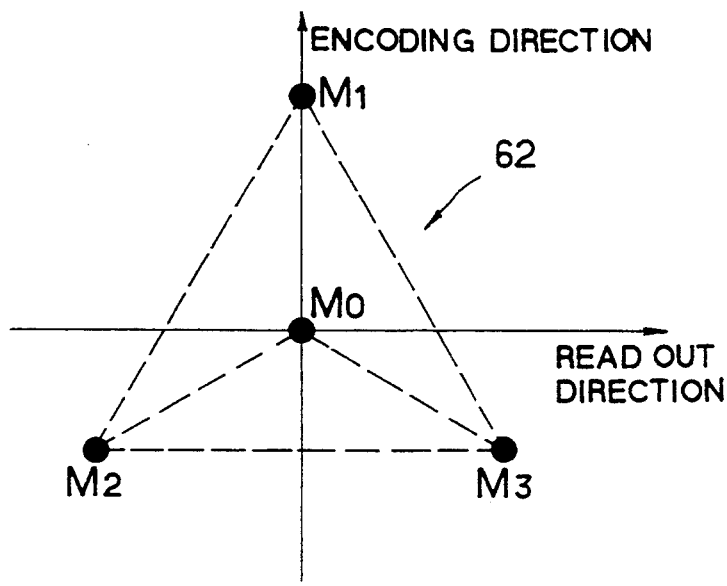

FIG. 7(b) shows still further preferred embodiment of the invention where a moment vector $\vec{m}_0$ is added to the three moment vectors $\vec{m}_i$ (i=1,2,3) in FIG. 7(a) which corresponds to the center $M_0$ of a triangle 62.

The first moment vector $\vec{m}_0$ is null vector and therefore does not impart the phase shift to the moving spin.

The operation of the embodiment, is similar to the operation for the embodiment shown in FIG. 7(a), but there is a difference compared with the embodiment in FIG. 7(a) where $v_{ij}$ are calculated by using $\vec{m}_i$ and $\vec{m}_j$ and furthermore $v_i$ are calculated by using $\vec{m}_i$ and $\vec{m}_0$.

The other flow velocity V' becomes:

$$V'^2 = (\tfrac{2}{3})\Sigma v_i^2 \ (i=1,2,3) \tag{10}$$

Therefore two different velocities can be detectable simultaneously and thus the narrow sensitive velocity range which appeared in MR Angiography techniques using phase shift effects, can be alleviated.

The above embodiments shown in FIG. 3, FIG. 5 and FIG. 7, are explained on condition that the tetrahedron and the triangle are "regular" tetrahedron and "regular" triangle respectively, but the configurations of the first moment vectors are not limited to these configurations but may be various tetrahedron and various triangle respectively. In this case, the vertices may be located in the 2-D or 3-D moment space so that the vertices are not located so distant from the origin.

Furthermore, the above embodiments, one of the vertices is located on the predetermined direction in the moment space but the vertices may be located in an aribitrary direction in the 3-D or 2-D moment space.

In the above embodiments, it is assumed that the moment vecors are first order moment vectors.

However the invention is not limited to the first moment vector but the invention can be applied to a predetermined n-order moment vector defined by the following equation:

$$m^{(n)} = \int_0^{t'} \frac{1}{n!} t^n \gamma G(t) dt \tag{11}$$

For example, a second order moment vector can be used.

Figure 8:
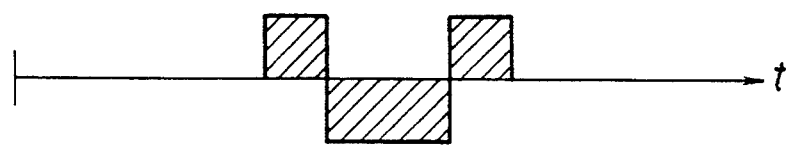
FIG. 8 shows a flow-encoding gradient for a second moment to encode an acceleration of the moving spin.

FIG. 8 shows a flow encoding pulse with s second order moment vector.

If the predetermined sets of pulse sequences with a second order moment vectors are provided and then the pulse sequences are implemented similarily in the first order moment vector, the acceleration data of the moving spin can be acquired and imaged.

What is claimed is:

1. A magnetic resonance imaging apparatus for imaging a moving spin in an object being examined, comprising:

means for predetermining sets of pulse sequences corresponding to predetermined moment vectors respectively which impart a phase shift to the moving spin;

means for acquiring echo data by implementing said pulse sequences;

means for calculating a flow-related value of the moving spin using the echo data; and means for generating image data of the moving spin using the flow-related value, wherein the moment vectors correspond to four vertices and a center of a tetrahedron respectively located in a three-dimensional moment space.

2. A magnetic resonance imaging apparatus according to claim 1, wherein the center of the tetrahedron is placed at an origin of the three-dimensional moment space.

3. A magnetic resonance imaging apparatus according to claim 2, wherein the moment vectors are first-order moment vectors and the flow-related value is a flow velocity.

4. A magnetic resonance imaging apparatus according to claim 2, wherein the moment vectors are second-order moment vectors and the flow-related value is an acceleration of the moving spin.

5. A magnetic resonance imaging apparatus according to claim 1, wherein the center of the tetrahedron is placed at a position other than an origin of the three-dimensional space.

6. A magnetic resonance imaging apparatus according to claim 1, wherein the tetrahedron is formed into a regular tetrahedron.

7. A magnetic resonance imaging apparatus according to claim 1, wherein the tetrahedron is formed into a non-regular tetrahedron.

8. A magnetic resonance imaging apparatus for imaging a moving spin in an object being examined, comprising:

means for predetermining sets of pulse sequences corresponding to predetermined moment vectors respectively which impart a phase shift to the moving spin;

means for acquiring echo data by implementing said pulse sequences;

means for calculating a flow-related value of the moving spin using the echo data; and means for generating image data of the moving spin using the flow-related value, wherein the moment vectors correspond to three vertices and a center of a triangle respectively located in a two-dimensional moment space.

9. A magnetic resonance imaging apparatus according to claim 8, wherein the center of the triangle is placed at an origin of the two-dimensional moment space.

10. A magnetic resonance imaging apparatus according to claim 9, wherein the moment vectors are first-order moment vectors and the flow-related value is a flow velocity.

11. A magnetic resonance imaging apparatus according to claim 9, wherein the moment vectors are second-order moment vectors and the flow-related value is an acceleration of the moving spin.

12. A magnetic resonance imaging apparatus according to claim 8, wherein the center of the triangle is placed at a position other than an origin of the two-dimensional space.

13. A magnetic resonance imaging apparatus according to claim 8, wherein the triangle is formed into a regular triangle.

14. A magnetic resonance imaging apparatus according to claim 8, wherein the triangle is formed into a non-regular triangle.

* * * * *

UNITED STATES PATENT AND TRADEMARK OFFICE
CERTIFICATE OF CORRECTION

PATENT NO. : 5,352,980
DATED : October 4, 1994
INVENTOR(S) : Yoshio Machida

It is certified that error appears in the above-identified patent and that said Letters Patent is hereby corrected as shown below:

Column 1, line 64, equation (5); correct to $$v_x = (\phi_{x+} - \phi_{x-}) / (m_{x+} - m_{x-})$$

Column 2, line 29 correct "appratus" to -- apparatus --;

Column 4, lines 6 - 18, equation (6), correct to:

$$\vec{m}_1 = (\ 1/2\,\Delta m,\ \sqrt{3}/6\,\Delta m,\ -\sqrt{6}/12\,\Delta m)$$
$$\vec{m}_2 = (\ 0,\ -\sqrt{3}/3\,\Delta m,\ -\sqrt{6}/12\,\Delta m)$$
$$\vec{m}_3 = (\ 0,\ 0,\ \sqrt{6}/4\,\Delta m)$$
$$\vec{m}_4 = (-1/2\,\Delta m,\ \sqrt{3}/6\,\Delta m,\ -\sqrt{6}/12\,\Delta m)$$

Signed and Sealed this

Eleventh Day of April, 1995

Attest:

BRUCE LEHMAN

Attesting Officer         Commissioner of Patents and Trademarks